United States Patent
Mitsugi et al.

(10) Patent No.: US 9,299,903 B1
(45) Date of Patent: Mar. 29, 2016

(54) SEMICONDUCTOR LIGHT EMITTING ELEMENT

(71) Applicant: Kabushiki Kaisha Toshiba, Minato-ku, Tokyo (JP)

(72) Inventors: Satoshi Mitsugi, Kawasaki Kanagawa (JP); Toshihide Ito, Minato Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/642,477

(22) Filed: Mar. 9, 2015

(30) Foreign Application Priority Data

Sep. 12, 2014 (JP) .................. 2014-187111

(51) Int. Cl.
| | |
|---|---|
| *H01L 51/44* | (2006.01) |
| *H01L 33/62* | (2010.01) |
| *H01L 33/00* | (2010.01) |
| *H01L 33/06* | (2010.01) |
| *H01L 33/32* | (2010.01) |
| *H01L 33/22* | (2010.01) |

(52) U.S. Cl.
CPC ............ *H01L 33/62* (2013.01); *H01L 33/0025* (2013.01); *H01L 33/06* (2013.01); *H01L 33/22* (2013.01); *H01L 33/32* (2013.01)

(58) Field of Classification Search
USPC .......................................................... 257/13
See application file for complete search history.

(56) References Cited

U.S. PATENT DOCUMENTS

| | | | |
|---|---|---|---|
| 7,700,959 B2 | 4/2010 | Suzuki et al. | |
| 8,525,204 B2 | 9/2013 | Fukshima et al. | |
| 8,772,809 B2 | 7/2014 | Furuki et al. | |
| 2007/0215886 A1* | 9/2007 | Takeuchi | H01L 33/0079 257/94 |
| 2009/0296366 A1* | 12/2009 | Shikina | H01L 51/5265 362/19 |
| 2013/0221367 A1 | 8/2013 | Furuki et al. | |
| 2013/0249384 A1* | 9/2013 | Sawabe | H01L 51/524 313/504 |

FOREIGN PATENT DOCUMENTS

JP  2006-120913  5/2006

* cited by examiner

*Primary Examiner* — Thao P Le
(74) *Attorney, Agent, or Firm* — White & Case LLP

(57) ABSTRACT

According to one embodiment, a semiconductor light emitting element includes a semiconductor layer, a first conductive layer, and a second conductive layer. The second conductive layer is provided between the semiconductor layer and the first conductive layer. A light transmittance of the second conductive layer is higher than a light transmittance of the first conductive layer. An extinction coefficient of the second conductive layer is 0.005 or less.

18 Claims, 10 Drawing Sheets

US 9,299,903 B1

SEMICONDUCTOR LIGHT EMITTING ELEMENT

CROSS-REFERENCE TO RELATED APPLICATIONS

This application is based upon and claims the benefit of priority from Japanese Patent Application No. 2014-187111, filed on Sep. 12, 2014; the entire contents of which are incorporated herein by reference.

FIELD

Embodiments described herein relate generally to a semiconductor light emitting element.

BACKGROUND

It is desirable to increase the light extraction efficiency of semiconductor light emitting elements (e.g., light emitting diodes).

DETAILED DESCRIPTION

Figure 1:
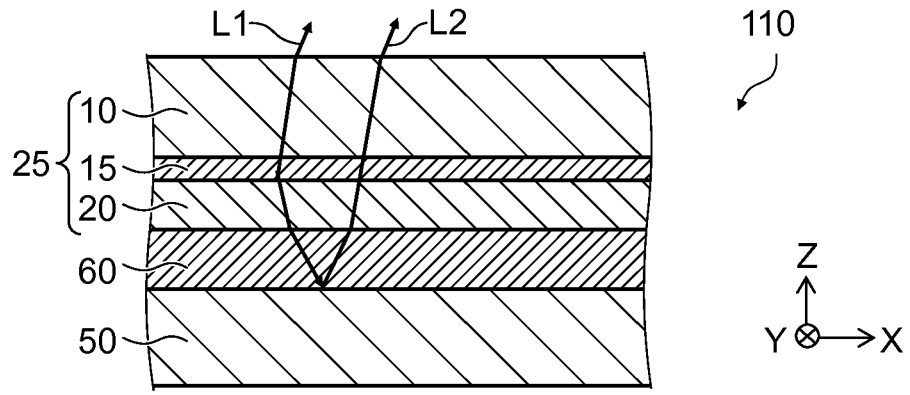
FIG. 1 is a schematic cross-sectional view illustrating a semiconductor light emitting element according to a first embodiment.

According to one embodiment, a semiconductor light emitting element includes a semiconductor layer, a first conductive layer, and a second conductive layer. The second conductive layer is provided between the semiconductor layer and the first conductive layer. A light transmittance of the second conductive layer is higher than a light transmittance of the first conductive layer. An extinction coefficient of the second conductive layer is 0.005 or less.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

FIG. 1 is a schematic cross-sectional view illustrating a semiconductor light emitting element according to a first embodiment.

As shown in FIG. 1, the semiconductor light emitting element 110 according to the embodiment includes a semiconductor layer 25, a first conductive layer 50, and a second conductive layer 60.

The semiconductor layer 25 emits light. For example, the semiconductor layer 25 includes a first semiconductor film 10 that includes a semiconductor film of a first conductivity type, a second semiconductor film 20 that includes a semiconductor film of a second conductivity type, and a third semiconductor film 15. The third semiconductor film 15 is provided between the first semiconductor film 10 and the second semiconductor film 20. The third semiconductor film 15 is, for example, an active film, e.g., a light emitting film.

The first conductivity type is, for example, an n-type; and the second conductivity type is, for example, a p-type. In the embodiment, the first conductivity type may be the p-type; and the second conductivity type may be the n-type. Hereinbelow, an example is described in which the first conductivity type is the n-type and the second conductivity type is the p-type.

The semiconductor layer 25 includes, for example, a nitride semiconductor. For example, the first semiconductor film 10, the second semiconductor film 20, and the third semiconductor film 15 include nitride semiconductors. The first semiconductor film 10 includes, for example, n-type GaN. The second semiconductor film 20 includes, for example, p-type GaN. The third semiconductor film 15 includes a well layer including InGaN. Examples of the semiconductor films are described below.

The refractive indexes of the first semiconductor film 10, the second semiconductor film 20, and the third semiconductor film 15 are, for example, not less than 2.0 and not more than 3.6. In the case where GaN is used as the semiconductor layer 25, the refractive index is about 2.47.

The second conductive layer 60 is provided between the semiconductor layer 25 and the first conductive layer 50.

The direction from the first conductive layer 50 toward the semiconductor layer 25 is taken as a Z-axis direction. One direction perpendicular to the Z-axis direction is taken as an X-axis direction. A direction perpendicular to the Z-axis direction and the X-axis direction is taken as a Y-axis direction.

The first conductive layer 50 extends along the X-Y plane. The second conductive layer 60 also extends along the X-Y plane.

The first conductive layer 50 is reflective. The second conductive layer 60 is light-transmissive. The light transmittance of the second conductive layer 60 is higher than the light transmittance of the first conductive layer 50. The optical reflectance of the first conductive layer 50 is higher than the optical reflectance of the second conductive layer 60.

For example, the first conductive layer 50 includes a reflective metal. The first conductive layer 50 includes, for example, silver or an alloy having silver as a major component. For example, aluminum or an alloy including aluminum (e.g., Si-containing Al, etc.) may be used as the first conductive layer 50. In the case where the semiconductor light emitting element 110 is, for example, a red light LED or an infrared LED, for example, Au, Cu, or an alloy including Au and/or Cu may be used as the first conductive layer 50.

For example, a light-transmissive oxide is used as the second conductive layer 60. The second conductive layer 60 includes, for example, an oxide including at least one element selected from the group consisting of In, Ga, Sn, Al, Zn, Ge, Sr, Mg, Ni, and Si.

A current is supplied to the third semiconductor film 15 via the first semiconductor film 10 and the second semiconductor film 20. To supply the current, the first conductive layer 50 and an electrode not shown in FIG. 1 are used. Light is emitted by the third semiconductor film 15 to which the current is supplied. In other words, the light is emitted from the semiconductor layer 25. The semiconductor light emitting element 110 is, for example, an LED.

A portion (light L1) of the light emitted from the third semiconductor film 15 passes through the first semiconductor film 10 and is emitted to the outside. A portion (light L2) of the light emitted from the third semiconductor film 15 passes through the second semiconductor film 20 and the second conductive layer 60, is reflected by the first conductive layer 50, passes through the second conductive layer 60 and the semiconductor layer 25, and is emitted to the outside. The front surface of the first semiconductor film 10 (the upper surface in FIG. 1) is used as, for example, a light extraction surface. The emitted light that is emitted from the semiconductor layer 25 (i.e., the light that is emitted from the third semiconductor film 15) is emitted mainly from the light extraction surface.

In the embodiment, the refractive index of the second conductive layer 60 for the emitted light is lower than the refractive index of the semiconductor layer 25 for the emitted light. For example, as recited above, the refractive index of the semiconductor layer 25 is not less than 2.3 and not more than 2.6. On the other hand, the refractive index of the second conductive layer 60 is, for example, not less than 1.5 but less than 2.3. For example, the refractive index of the second conductive layer 60 is, for example, not less than 1.6 and not more than 2.2.

First, characteristics of a first reference example will be described in which the second conductive layer 60 is not provided, and the first conductive layer 50 contacts the semiconductor layer 25.

The refractive index of the semiconductor layer 25 is $n_s$. The refractive index of the first conductive layer 50 is $n_m$. These refractive indexes are complex indices of refraction. These refractive indexes include the extinction coefficient of light.

In the first reference example, a reflectance R (in the case of perpendicular incidence) of the interface between the first conductive layer 50 and the semiconductor layer 25 is expressed by the following first formula.

$$R = \frac{\{\text{Re}(n_m) - n_s\}^2 + \text{Im}(n_m)^2}{\{\text{Re}(n_m) + n_s\}^2 + \text{Im}(n_m)^2} \quad (1)$$

In the first formula, $\text{Re}(n_m)$ is the real part of the refractive index $n_m$ of the first conductive layer 50. $\text{Im}(n_m)$ is the imaginary part of the refractive index $n_m$ of the first conductive layer 50. In the first formula recited above, the imaginary part of the refractive index $n_s$ of the semiconductor layer 25 is small enough to be ignored.

Because the first conductive layer 50 includes a reflective metal, the real part $\text{Re}(n_m)$ of the refractive index $n_m$ of the first conductive layer 50 is less than 1. Or, the imaginary part $\text{Im}(n_m)$ of the refractive index $n_m$ of the first conductive layer 50 is extremely large and is not less than about 5.

The refractive index $n_s$ of the semiconductor layer 25 is high. Therefore, in the first reference example in which the semiconductor layer 25 contacts the first conductive layer 50, the reflectance R is low at the interface between the semiconductor layer 25 and the first conductive layer 50 for many metals other than Ag that may be used as the first conductive layer 50.

On the other hand, for Ag, the real part (i.e., $\text{Re}(n_m)$) of the refractive index $n_m$ is extremely small and is not less than about 0.03 and not more than about 0.2. Therefore, in the case where Ag is used as the first conductive layer 50, the difference between the numerator and the denominator in the first formula is small. Therefore, a higher reflectance is obtained at the interface between the semiconductor layer 25 and the first conductive layer 50 than when a metal other than Ag is used. The refractive index is affected by the wavelength, the purity of Ag, the surface state, the grain size, etc.

A configuration in which the second conductive layer 60 is provided between the first conductive layer 50 and the semiconductor layer 25 will now be described. The refractive index of the second conductive layer 60 is $n_t$. The refractive index $n_t$ is a complex refractive index and includes the extinction coefficient.

First, a second reference example will be described in which the second conductive layer 60 has no light absorption. In such a case, the imaginary part of the refractive index $n_t$ is 0. The refractive index $n_t$ of the second conductive layer 60 is lower than the refractive index $n_s$ of the semiconductor layer 25. In such a second reference example, the reflectance R of the interface between the first conductive layer 50 and the second conductive layer 60 is obtained by replacing the refractive index $n_s$ of the first formula recited above with the refractive index $n_t$.

The reflectance R of the second reference example is higher than the reflectance R of the first reference example recited above. In other words, the reflectance R of the interface between the first conductive layer 50 and the semiconductor layer 25 is relatively low for the first reference example in which the second conductive layer 60 is not provided and the first conductive layer 50 contacts the semiconductor layer 25. In the second reference example, the second conductive layer 60 that has the refractive index $n_t$ which is lower than the refractive index $n_s$ of the semiconductor layer 25 is provided between the first conductive layer 50 and the semiconductor layer 25. In the second reference example, the reflectance R of the interface between the first conductive layer 50 and the second conductive layer 60 is higher than the reflectance R of the first reference example. It is considered that a higher light extraction efficiency is obtained in the second reference example than in the first reference example.

Further, by using the second conductive layer 60 that has the refractive index $n_t$ which is lower than the refractive index $n_s$ of the semiconductor layer 25 in the second reference example, a frequency component that undergoes total internal reflection at the interface between the second conductive layer 60 and the semiconductor layer 25 occurs. Thereby, a TIR (total internal reflector or total reflection mirror) is partially formed. It is considered that the high light extraction efficiency is obtained for this reason.

The light absorption of the second conductive layer 60 is ignored in the second reference example recited above. However, actually, the light absorption exists. Accordingly, in the case where the design is performed without considering the light absorption, there are cases where the actual reflectance is lower than that of the first reference example. The light absorption is considered for the second conductive layer 60 that is used in the embodiment.

In other words, to obtain the conductivity in the second conductive layer 60, light absorption occurs due to free carriers. For example, in the case where ITO (Indium Tin Oxide) is used as the second conductive layer 60, the imaginary part of the refractive index of the ITO is, for example, about 0.02. For example, for ITO having a thickness of 1 μm, the loss of the light round trip is about 67%. On the other hand, in the case where the second conductive layer 60 is set to be excessively thin, the characteristics of the TIR degrade; and the intended functions are insufficient.

Accordingly, it is favorable for the thickness of the second conductive layer to be, for example, $\lambda/2\mathrm{Re}(n_t)$ or more. It is more favorable to be about $\lambda/\mathrm{Re}(n_t)$. Here, $\lambda$ is the wavelength in a vacuum (substantially the same as the wavelength in air) of the light emitted from the semiconductor layer 25. Thereby, the function of the TIR is obtained effectively.

In the embodiment, the loss of the light is reduced while setting the thickness of the second conductive layer 60 to be somewhat thick.

In the second conductive layer 60, it is desirable for the imaginary part $\mathrm{Im}(n_t)$ of the refractive index $n_t$, i.e., the optical absorptance, to be low. Simultaneously, it is necessary for the second conductive layer 60 to be conductive. The relationship between the electrical resistivity and the absorptance of the second conductive layer 60 will now be described.

An electrical resistivity ρ of the second conductive layer 60 is expressed by the following second formula.

$$\rho = \frac{1}{Nq\mu} \quad (2)$$

In the second formula, N is the carrier density. q is the carrier charge. μ is the carrier mobility.

On the other hand, the complex refractive index $n_t$ of the second conductive layer 60 is expressed by the following third to fifth formulas.

$$n_t^2 = 1 - \frac{\omega_p^2}{\omega\left(\omega + \frac{i}{\tau}\right)} \quad (3)$$

$$\omega_p^2 = \frac{Nq^2}{\varepsilon m^*} \quad (4)$$

$$\tau = \frac{m^*}{\varepsilon}\mu \quad (5)$$

In the formulas recited above, ε is the dielectric constant. m* is the carrier effective mass. $\omega_p$ is the plasma angular frequency. τ is the scattering relaxation time. ω is the angular frequency of light. i is the imaginary unit.

An extinction coefficient κ of the second conductive layer 60 corresponds to the imaginary part of the complex refractive index $n_t$. The extinction coefficient κ and an absorption coefficient α have the relationship $\kappa=\alpha\lambda/4\pi$. The absorption can be suppressed by reducing the extinction coefficient κ.

On the other hand, as expressed by the second to fifth formulas recited above, there is an intimate relationship between the electrical resistivity ρ and the extinction coefficient κ.

Figure 2:
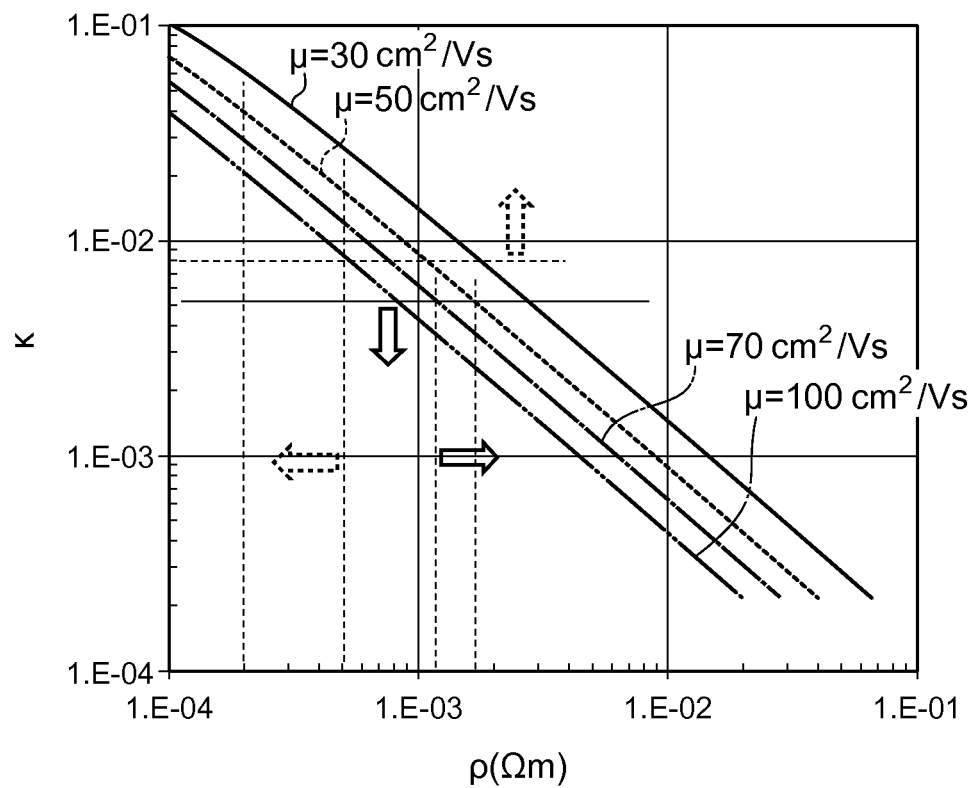
FIG. 2 is a graph of characteristics of the conductive layer.

FIG. 2 is a graph of characteristics of the conductive layer.

FIG. 2 illustrates the relationship between the electrical resistivity ρ and the extinction coefficient κ. The characteristics are determined based on the second to fifth formulas. In the case where ITO is used as the second conductive layer 60, the carrier effective mass m* is about 0.2 $m_0$ to 0.5 $m_0$. $m_0$ is the rest mass of an electron. In the example of FIG. 2, 0.3 $m_0$ is used as m* (the carrier effective mass). The real part of the complex refractive index $n_t$ is taken to be 2.09. In other words, $2.09^2 \varepsilon_0$ is used as $\varepsilon$ ($\varepsilon_0$ being the dielectric constant of a vacuum). Cases are illustrated where μ (the mobility) is 30, 50, 70, and 100 (cm²/Vs). A value determined by solving backward from the effective mass is used as τ. The horizontal axis of FIG. 2 is the electrical resistivity ρ (Ωm). The vertical axis is the extinction coefficient κ.

As shown in FIG. 2, the extinction coefficient increases as the electrical resistivity ρ decreases for a constant mobility μ. Accordingly, the extinction coefficient κ increases abruptly when the material of the second conductive layer 60 is selected to reduce the electrical resistivity ρ.

For example, in the case where ITO is used as the second conductive layer 60, normally, the mobility μ is about 40 cm²/Vs to about 70 cm²/Vs.

The electrical resistivity ρ of the light-transmissive conductive layer used as the electrode of the semiconductor light emitting element generally is about $2\times10^{-4}$ Ωm. Generally, the electrical resistivity ρ is $5\times10^{-4}$ Ωm or less. This is determined from the perspective of uniformly supplying sufficient current to the semiconductor layer by reducing the resistance.

From FIG. 2, the extinction coefficient κ is about $4\times10^{-2}$ for an electrical resistivity ρ of $2\times10^{-4}$ Ωm when the mobility μ is about 50 cm²/Vs. The extinction coefficient κ is about $2\times10^{-2}$ for an electrical resistivity ρ of $5\times10^{-4}$ Ωm when the mobility μ is about 50 cm²/Vs. The extinction coefficient κ is about $3\times10^{-2}$ for an electrical resistivity ρ of $2\times10^{-4}$ Ωm when the mobility μ is about 70 cm²/Vs. The extinction coefficient κ is about $1.1\times10^{-2}$ for an electrical resistivity ρ of $5\times10^{-4}$ Ωm when the mobility μ is about 70 cm²/Vs. In other words, the lowest estimate of the extinction coefficient κ of a general light-transmissive electrode used in the semiconductor light emitting element is 0.011 or more.

Conversely, in the semiconductor light emitting element 110 according to the embodiment, the extinction coefficient κ of the second conductive layer 60 is set to be 0.005 or less. In other words, the extinction coefficient κ used in the embodiment is in a range that is not generally used.

In such a case, as shown in FIG. 2, the electrical resistivity ρ is about $1.8\times10^{-3}$ Ωm when the mobility μ is about 50 cm²/Vs. The electrical resistivity ρ is about $1.1\times10^{-3}$ Ωm when the mobility μ is about 70 cm²/Vs. In other words, in the embodiment, the electrical resistivity ρ is $1.1 \times 10^{-3}$ Ωm or more which is higher than the electrical resistivity ($5 \times 10^{-4}$ Ωm or less) of general light-transmissive conductive materials.

In other words, to reduce the extinction coefficient κ of the light-transmissive conductive layer in the embodiment, the electrical resistivity ρ is not set to be low. Thereby, the light absorption is suppressed; and high light utilization efficiency is obtained.

In the embodiment, for example, the extinction coefficient κ is 0.005 or less. In such a case, the electrical resistivity ρ is $1.1 \times 10^{-3}$ Ωm or more.

In the embodiment, there is a tendency for the electrical resistivity ρ to be higher than the characteristics illustrated in FIG. 2 due to the effects of the impurities, the effects of the band edges, and the effects of a portion of the carriers being inert. Accordingly, in the embodiment, the electrical resistivity ρ may be $2 \times 10^{-3}$ Ωm or more when the extinction coefficient κ is 0.005 or less. The electrical resistivity ρ may be $5 \times 10^{-3}$ Ωm or more when the extinction coefficient κ is 0.005 or less. The electrical resistivity ρ may be $1 \times 10^{-2}$ Ωm or more when the extinction coefficient κ is 0.005 or less.

For general light-transmissive conductive layers, due to the effects of the impurities, the effects of the band edges, and the effects of a portion of the carriers being inert, the extinction coefficient κ may be 0.01, 0.02, or more when the electrical resistivity ρ is $2 \times 10^{-3}$ Ωm. In other words, the actual extinction coefficient κ is higher than the characteristics illustrated in FIG. 2.

In a reference example in which the extinction coefficient κ of the second conductive layer 60 is large, the absorption of the light becomes excessively large when the second conductive layer 60 is set to be thick to obtain the TIR effect. Therefore, conversely, the loss of the light is increased by providing the second conductive layer 60.

Conversely, in the embodiment, the extinction coefficient κ is set to be 0.005 or less which is markedly less than the general value of 0.01 to 0.02. Thereby, the absorption of the light by the second conductive layer 60 can be suppressed. Thereby, the absorption of the light is small even when the second conductive layer 60 is set to be thick to obtain the TIR effect. Therefore, by providing the second conductive layer 60, the extraction effect of the light is greater due to the effect of the TIR; and the extraction effect is greater than the loss due to the absorption of the light. As a result, the light extraction efficiency increases.

The proportion of the loss of energy due to the light absorption of the second conductive layer 60 is expressed by the following sixth formula.

$$1 - \exp\left(-\frac{4\pi \text{Im}(n_t)}{\lambda} \cdot \frac{2\lambda}{\text{Re}(n_t)}\right) = 1 - \exp\left(-\frac{8\pi \text{Im}(n_t)}{\text{Re}(n_t)}\right) \quad (6)$$

$\text{Im}(n_t)$ corresponds to the extinction coefficient κ.

An effect TR(d) of total internal reflection (evanescent waves) of the second conductive layer 60 is expressed by the following seventh to ninth formulas.

$$Le(\theta, n_1, n_2) = \left| \frac{\lambda}{2\pi n_1} \cdot \frac{1}{\sqrt{\sin^2\theta - \left(\frac{n_2}{n_1}\right)^2}} \right| \quad (7)$$

$$\theta_c = \sin^{-1}\left(\frac{n_2}{n_1}\right) \quad (8)$$

$$TR(d) = \frac{\int_{\theta_c}^{\frac{\pi}{2}} \sin\theta \cdot \cos\theta \cdot \left(1 - \exp\left(\frac{-d}{Le(\theta, n_1, n_2)}\right)\right) d\theta}{\int_{\theta}^{\frac{\pi}{2}} \sin\theta \cdot \cos\theta d\theta} \quad (9)$$

In the formulas recited above, $Le(\theta, n_s, n_t)$ is the penetration depth of the evanescent waves. θ is the travel angle of the light inside the semiconductor layer 25. $n_s$ is the refractive index of the semiconductor layer 25. $n_t$ is the refractive index of the second conductive layer 60. λ is the wavelength in a vacuum of the light emitted from the semiconductor layer 25. The wavelength of the light in a vacuum is substantially the same as the wavelength of the light in air. $\theta_c$ is the critical angle. In the ninth formula, the light distribution is assumed to be a Lambertian light distribution. d is the thickness of the second conductive layer 60.

Figure 3:
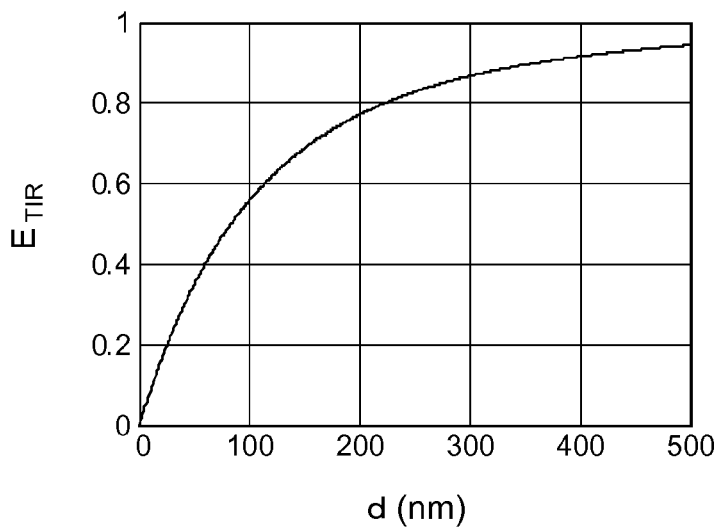
FIG. 3 is a graph of a characteristic of the semiconductor light emitting element.

FIG. 3 is a graph of a characteristic of the semiconductor light emitting element.

FIG. 3 illustrates the relationship between an effect $E_{TIR}$ of the TIR and the thickness d of the second conductive layer 60. FIG. 3 is derived based on the ninth formula. In the example, the value when the thickness d of the second conductive layer 60 is infinity in the ninth formula is used as the reference (=1) for the effect $E_{TIR}$ of the TIR.

The average power reflectance Rr(d) (corresponding to an effect IF of the interference) of the second conductive layer 60 is expressed by the following tenth to eighteenth formulas.

$$Rs(\theta, n_1, n_2) = \frac{\sqrt{n_2^2 - n_1^2 + n_1^2 \cdot \cos^2\theta} - n_1 \cdot \cos\theta}{n_2^2 - n_1^2 + n_1^2 \cdot \cos^2\theta + n_1 \cdot \cos\theta} \quad (10)$$

$$Rp(\theta, n_1, n_2) = \frac{n_2 \cdot \cos\theta - \sqrt{n_2^2 - n_1^2 + n_1^2 \cdot \cos^2\theta} \cdot \frac{n_1}{n_2}}{n_2 \cdot \cos\theta + \sqrt{n_2^2 - n_1^2 + n_1^2 \cdot \cos^2\theta} \cdot \frac{n_1}{n_2}} \quad (11)$$

$$Ts(\theta, n_1, n_2) = 1 + Rs(\theta, n_1, n_2) \quad (12)$$

$$Tp(\theta, n_1, n_2) = \frac{n_1}{n_2} \cdot (1 - Rp(\theta, n_1, n_2)) \quad (13)$$

$$\Theta(\theta) = \sin^{-1}\left(\sin\theta \cdot \frac{n_1}{n_2}\right) \quad (14)$$

$$\phi(\theta, d) = \exp\left(-4i\pi \cdot \frac{d \cdot n_2 \cdot \cos\theta}{\lambda}\right) \quad (15)$$

$$As(\theta, n_1, n_2, n_m, d) = Rs(\theta, n_1, n_2) + \quad (16)$$
$$\frac{Ts(\theta, n_1, n_2) \cdot Ts(\Theta(\theta), n_2, n_1) \cdot \phi(\Theta(\theta), d) \cdot Rs(\Theta(\theta), n_2, n_m)}{1 - \phi(\Theta(\theta), d) \cdot Rs(\Theta(\theta), n_2, n_m) \cdot Rs(\Theta(\theta), n_2, n_1)}$$

$$Ap(\theta, n_1, n_2, n_m, d) = Rp(\theta, n_1, n_2) + \quad (17)$$
$$\frac{Tp(\theta, n_1, n_2) \cdot Tp(\Theta(\theta), n_2, n_1) \cdot \phi(\Theta(\theta), d) \cdot Rp(\Theta(\theta), n_2, n_m)}{1 - \phi(\Theta(\theta), d) \cdot Rp(\Theta(\theta), n_2, n_m) \cdot Rp(\Theta(\theta), n_2, n_1)}$$

$$Rr(d) = \frac{\int_0^{\frac{\pi}{2}} \sin\theta \cdot \cos\theta \cdot [(|As(\theta, n_1, n_2, n_m, d)|)^2 + (|Ap(\theta, n_1, n_2, n_m, d)|)^2] d\theta}{\int_0^{\frac{\pi}{2}} \sin\theta \cdot \cos\theta \cdot 2 d\theta} \quad (18)$$

In the formulas recited above, θ is the travel angle of the light inside the semiconductor layer. $n_1$ is the semiconductor refractive index (a real number). $n_2$ is the transparent conductive layer refractive index (a real number). $n_m$ is the metal layer refractive index (a complex number). $\lambda$ is the vacuum wavelength of the light (substantially the same as the wavelength in air). i is the imaginary unit. $\theta_c$ is the critical angle (the angle at which total internal reflection occurs). $Rs(\theta, n_1, n_2)$ is the amplitude reflectance (S-waves and Fresnel reflections). $Rp(\theta, n_1, n_2)$ is the amplitude reflectance (P-waves and Fresnel reflections). $Ts(\theta, n_1, n_2)$ is the amplitude transmittance (S-waves and Fresnel reflections). $Tp(\theta, n_1, n_2)$ is the amplitude transmittance (P-waves and Fresnel reflections). OM is the travel angle of the light inside the transparent conductive layer. d is the thickness of the transparent conductive layer. $\phi(\theta, d)$ is the round trip phase change amount inside the transparent conductive layer. $As(\theta, n_1, n_2, n_m, d)$ is the amplitude reflectance (including interference due to multiple reflections for each angular component) (S-waves and multiple reflections) of the transparent conductive layer/metal conductive layer as viewed from the semiconductor layer. $Ap(\theta, n_1, n_2, n_m, d)$ is the amplitude reflectance (including interference due to multiple reflections for each angular component) (P-waves and multiple reflections) of the transparent conductive layer/metal conductive layer as viewed from the semiconductor layer. $Rr(d)$ is the average power reflectance. In the eighteenth formula, the light distribution is a Lambertian light distribution.

Figure 4A:
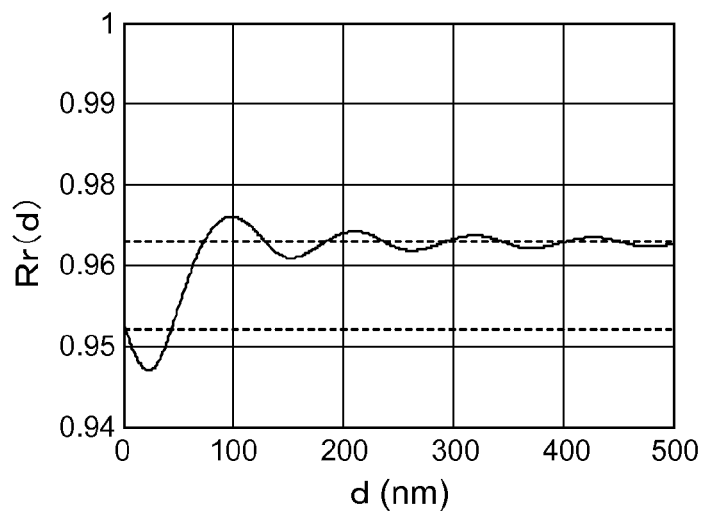
FIG. 4A and FIG. 4B are graphs of characteristics of the semiconductor light emitting element.
Figure 4B:
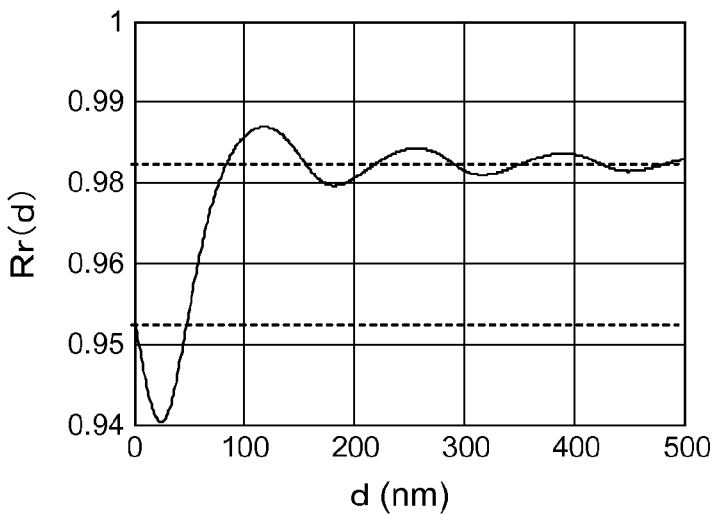

FIG. 4A and FIG. 4B are graphs of characteristics of the semiconductor light emitting element.

FIG. 4A and FIG. 4B illustrate the relationship between the average power reflectance $Rr(d)$ and the thickness d of the second conductive layer 60 for two types of conditions. FIG. 4A and FIG. 4B are graphs of the results of calculations using the eighteenth formula.

The conditions of FIG. 4A are as follows.

The refractive index $n_s$ of the semiconductor layer 25=2.47.

The refractive index $n_t$ of the semiconductor layer 25=2.09.

The refractive index $n_m$ of the first conductive layer 50=0.1+2.5i (i being the imaginary unit).

The wavelength in a vacuum of the light emitted from the semiconductor layer 25=450 nm.

The normal-incidence reflectance of the first conductive layer 50 is 92.3%; and the whole solid angle average is 95.5%. As shown in FIG. 4A, the average power reflectance $Rr(d)$ converges to 0.967.

The conditions of FIG. 4B are as follows.

The refractive index $n_s$ of the semiconductor layer 25=2.47.

The refractive index $n_t$ of the semiconductor layer 25=1.70.

The refractive index $n_m$ of the first conductive layer 50=0.1+2.5i (i being the imaginary unit).

The wavelength $\lambda$ in a vacuum of the light emitted from the semiconductor layer 25=450 nm.

As shown in FIG. 4B, the average power reflectance $Rr(d)$ converges to 0.979.

Figure 5:
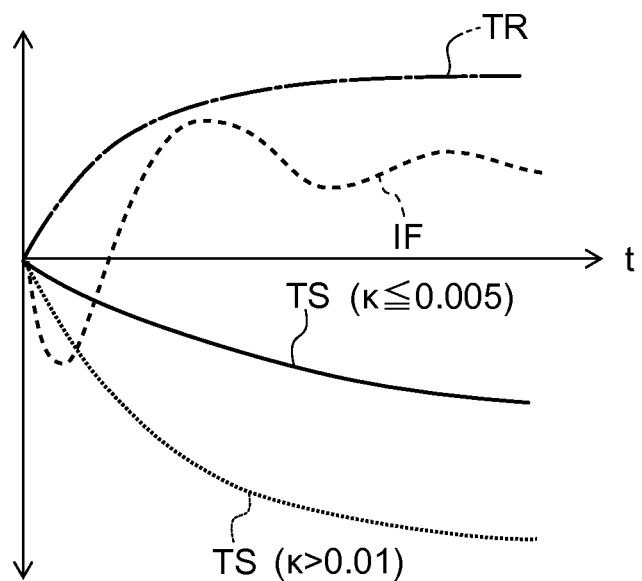
FIG. 5 is a schematic view illustrating characteristics of the semiconductor light emitting element.

FIG. 5 is a schematic view illustrating characteristics of the semiconductor light emitting element.

FIG. 5 illustrates the optical characteristics of the light-transmissive second conductive layer 60, i.e., a transmittance TS, the effect TR of total internal reflection, and the effect IF of interference due to multiple reflections. The horizontal axis is a thickness t of the second conductive layer 60. In the example, the case where the extinction coefficient $\kappa$ is small ($\kappa \leq 0.005$) and the case where the extinction coefficient $\kappa$ is large ($\kappa > 0.01$) are schematically shown. On the vertical axis of FIG. 5, the upward direction corresponds to increasing average power reflectance. The downward direction corresponds to decreasing average power reflectance.

As shown in FIG. 5, the transmittance TS increases and gradually approaches 1 as the thickness t increases. The decrease of the transmittance TS is due to the light absorption. The decrease of the transmittance TS is abrupt when the extinction coefficient $\kappa$ is large. A high transmittance TS can be maintained when the extinction coefficient $\kappa$ is small.

On the other hand, the effect TR of total internal reflection decreases as the thickness t increases. The effect TR of total internal reflection is due to the penetration depth of the evanescent waves. As the thickness t increases, the effect IF of interference oscillates and the amplitude decreases.

The second conductive layer 60 can reduce the loss of the light by returning the evanescent waves seeping into the second conductive layer 60 from the semiconductor layer 25 back into the semiconductor layer 25. Thereby, the function of the TIR is obtained sufficiently. For example, it is favorable for the thickness t of the second conductive layer 60 to be $\lambda/2\text{Re}(n_t)$ or more. It is favorable for the thickness t to be, for example, about $\lambda/\text{Re}(n_t)$. Here, $\lambda$ is the wavelength in a vacuum of the light emitted from the semiconductor layer 25 (substantially the same as the wavelength in air). Thereby, the function of the TIR is obtained effectively.

As illustrated in FIG. 2, because the effect IF of interference oscillates, it is favorable for the thickness t to be set to conditions where the effect IF of interference is a maximum. The thickness t that corresponds to the initial maximum value of the effect IF of interference shown in FIG. 2 is substantially $\lambda/\text{Re}(n_t)$. Practically, the effect IF of interference can be utilized effectively by setting the thickness t to be not less than about 0.7 times and not more than about 1.4 times $\lambda/\text{Re}(n_t)$.

As shown in FIG. 5, in the case where the extinction coefficient $\kappa$ is large, the loss due to the absorption is large; and the decrease of the transmittance TS is larger than the effect TR of total internal reflection and the effect IF of interference. Therefore, high light extraction efficiency is not obtained. Conversely, by setting the extinction coefficient $\kappa$ to be small, the loss due to absorption can be smaller than the effect TR of total internal reflection and the effect IF of interference. Thereby, high light extraction effect is obtained.

Figure 6A:
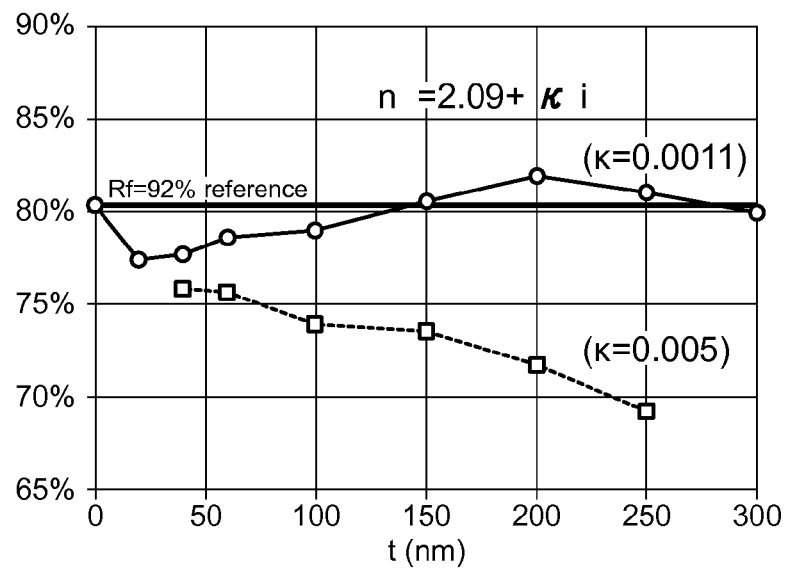
FIG. 6A and FIG. 6B are graphs of characteristics of the semiconductor light emitting element.
Figure 6B:
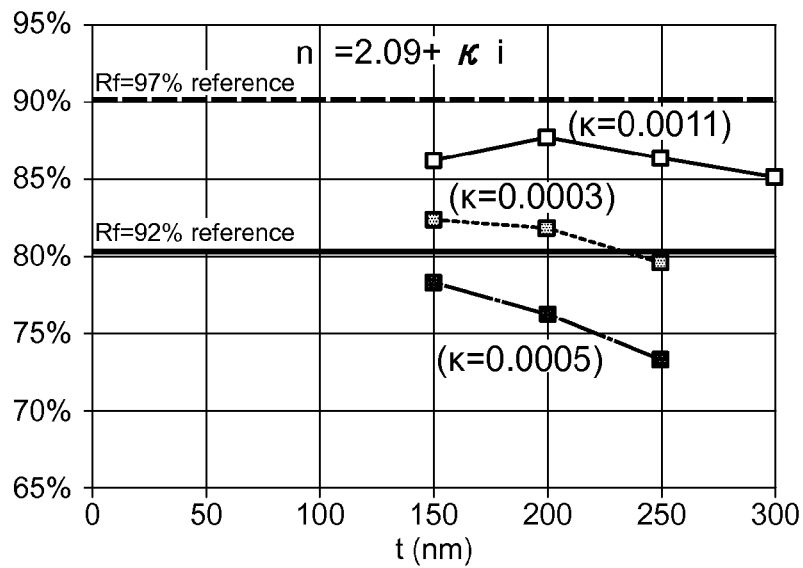

FIG. 6A and FIG. 6B are graphs of characteristics of the semiconductor light emitting element.

FIG. 6A and FIG. 6B illustrate simulation results of the light extraction efficiency when considering the transmittance TS, the effect TR of total internal reflection, and the effect IF of interference recited above.

In the example of FIG. 6A, a reflectance Rf of the first conductive layer 50 is 92%. The refractive index $n_t$ of the second conductive layer 60 is $2.09+\kappa i$. The case where $\kappa=0.0011$ and the case where $\kappa=0.005$ are illustrated. The case where $\kappa=0.0011$ corresponds to ITO. The refractive index $n_s$ of the semiconductor layer 25 is $2.47+0.000036i$. This value corresponds to GaN. The refractive index $n_m$ of the first conductive layer 50 is $0.1+2.5i$. This value corresponds to Ag. The wavelength $\lambda$ (the wavelength in air or in a vacuum) of the light emitted from the semiconductor layer 25 is 450 nm. A wavelength $\lambda 1$ inside the second conductive layer 60 is $\lambda/\text{Re}(n_t)$ which is 215.3 nm.

The example of FIG. 6B is calculated by assuming that a good surface state of the first conductive layer is maintained by the existence of the second conductive layer; and the reflectance Rf of the first conductive layer 50 in this case is 97%. Realistically, the value may be 92% to 97%. The refractive index $n_t$ of the second conductive layer 60 is $2.09+\kappa i$. The case where $\kappa=0.0011$, the case where $\kappa=0.0003$, and the case where $\kappa=0.0005$ are illustrated.

In this model, a random unevenness is provided in the light extraction surface of the semiconductor layer 25; and the entire semiconductor element is covered with a resin having a refractive index of 1.5. A FDTD method (finite-difference time-domain method) that uses a periodic boundary is used in the simulation. The effects of the electrode opposing the first conductive layer 50 are ignored. The intensity of the light emitted to the outside is determined for a TE-like light emission (a light source in which the electric dipoles oscillate parallel to the active layer surface) and a TM-like light emission (a light source in which the electric dipoles oscillate perpendicularly to the active layer surface). These intensities are totaled; and a light extraction efficiency Eff is determined. FIGS. 6A and 6B show the light extraction efficiency Eff for different thicknesses t of the second conductive layer 60. The horizontal axis is the thickness t; and the vertical axis is the light extraction efficiency Eff.

For a reflectance Rf of 92% as shown in FIGS. 6A and 6B, the light extraction efficiency Eff is about 80% when the thickness t is 0, that is, when the second conductive layer 60 is not provided. When the thickness t of the second conductive layer 60 is 20 nm, the light extraction efficiency Eff decreases to about 77%. This is due to the effect IF of interference illustrated in FIG. 5. In the range of the thickness t from 20 nm to 200 nm, the light extraction efficiency Eff increases as the thickness t increases. It is considered that this is due to a large contribution of the effect TR of total internal reflection illustrated in FIG. 5 (the effect of the TIR). Then, when the thickness t exceeds 200 nm, the light extraction efficiency Eff decreases as the thickness t increases. In this range, the effect of the transmittance TS becomes large due to the absorption.

For a wavelength of 450 nm, the light extraction efficiency Eff is high when the thickness t of the second conductive layer 60 is not less than 140 nm and not more than 280 nm. In other words, the light extraction efficiency Eff is high when the thickness t of the second conductive layer 60 is not less than $(2/3)·\lambda 1$ and not more than $(4/3)·\lambda 1$, that is, not less than $(2/3)·\lambda/Re(n_r)$ and not more than $(4/3)·\lambda/Re(n_r)$.

In the embodiment, the thickness t of the second conductive layer 60 is not less than 2/3 and not more than 4/3 of the wavelength inside the second conductive layer 60 of the light emitted from the semiconductor layer 25, i.e., not less than 0.67 times and not more than 1.33 times the wavelength. Thereby, high luminous efficiency is obtained.

Figure 7A:
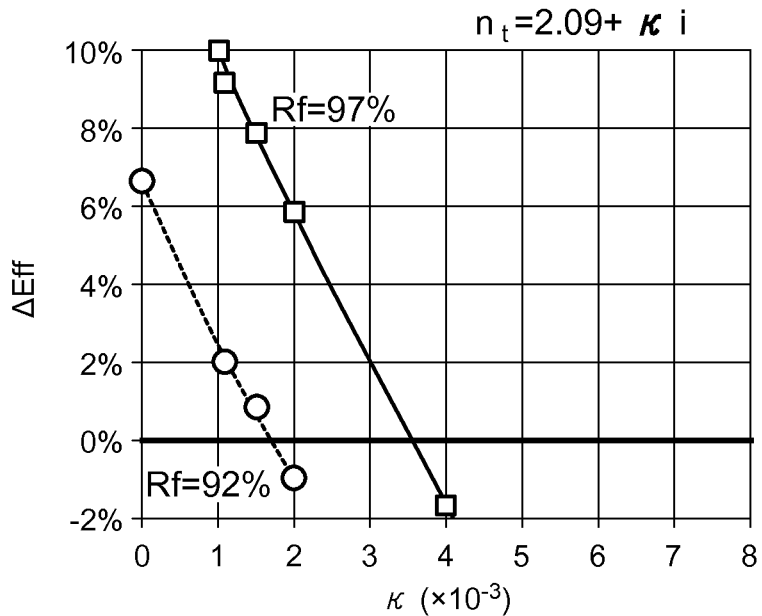
FIG. 7A and FIG. 7B are graphs of characteristics of the semiconductor light emitting element.
Figure 7B:
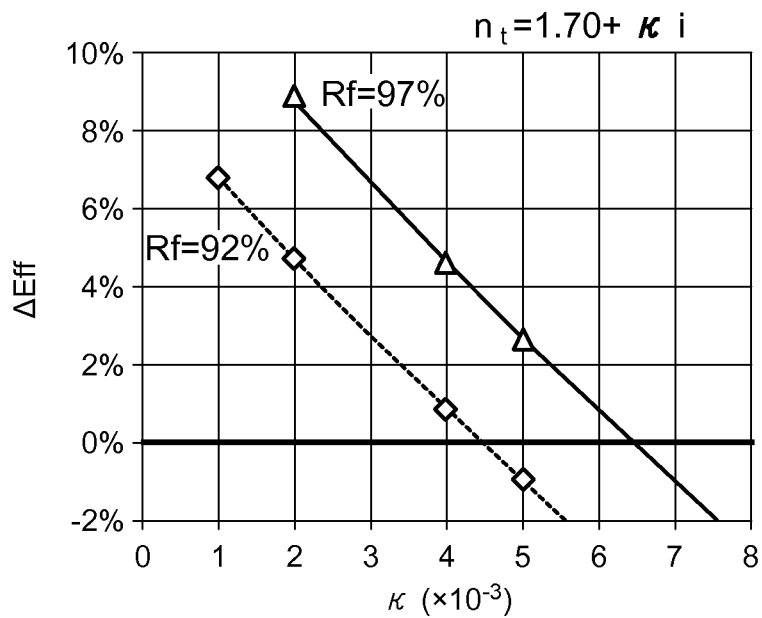

FIG. 7A and FIG. 7B are graphs of characteristics of the semiconductor light emitting element.

These drawings show the change rate of a light extraction efficiency Eff1 when the second conductive layer 60 is provided compared to a light extraction efficiency Eff0 when the second conductive layer 60 is not provided. The vertical axis is a change rate $\Delta$Eff of the light extraction efficiency. $\Delta$Eff= (Eff1−Eff0)/Eff0. The horizontal axis is the extinction coefficient $\kappa$.

In FIG. 7A, the refractive index $n_r$ of the second conductive layer 60 is 2.09+$\kappa$i. In FIG. 7B, the refractive index $n_r$ of the second conductive layer 60 is 1.70+$\kappa$i. These drawings illustrate the case where the reflectance Rf of the first conductive layer 50 is 92% and the case where the reflectance Rf of the first conductive layer 50 is 97% (similar to the example of FIGS. 6A and 6B). The thickness t of the second conductive layer 60 is the thickness (200 nm) at which the maximum light extraction efficiency is obtained for the cases recited above. Otherwise, the conditions described in regard to FIGS. 6A and 6B are used.

As shown in FIG. 7A, for a reflectance Rf of 92%, the change rate $\Delta$Eff of the light extraction efficiency has a maximum of about 6.8% when the extinction coefficient $\kappa$ is 0. For a reflectance Rf of 97%, for example, the change rate $\Delta$Eff of the light extraction efficiency is about 10.0% when the extinction coefficient $\kappa$ is 0.001.

The change rate $\Delta$Eff of the light extraction efficiency decreases as the extinction coefficient $\kappa$ increases. As described above, this is because the loss due to absorption increases as the extinction coefficient $\kappa$ increases.

In the case where the real part of the refractive index $n_r$ is 1.70 as shown in FIG. 7B, the upper limit of the extinction coefficient $\kappa$ is higher than in the case where the real part of the refractive index $n_r$ is 2.09.

An example of the method for manufacturing the semiconductor light emitting element 110 will now be described.

Epitaxial growth on a substrate is performed for the semiconductor layer 25, the film used to form the second conductive layer 60, the second semiconductor film 20, the third semiconductor film 15, and the first semiconductor film 10 in this order.

In such a case, for example, the absorption can be reduced by setting the Sn concentration of the film used to form the second conductive layer 60 to be low. For example, the refractive index can be reduced by setting the density of the film used to form the second conductive layer 60 to be low. Thereby, a small extinction coefficient $\kappa$ is obtained. In the case where the second conductive layer 60 includes indium (In), tin (Sn) and oxygen (O), the Sn concentration of the second conductive layer 60 is, for example, 5% or less of the In concentration. The Sn concentration of the second conductive layer 60 is, for example, 2% or less of the In concentration.

Sputtering may be used as a method for forming the films. In the sputtering as well, the absorption can be reduced by setting the Sn concentration to be low. In the sputtering as well, the refractive index can be reduced by setting the density to be low. Thereby, a small extinction coefficient $\kappa$ is obtained. In the case where the second conductive layer 60 includes indium (In), tin (Sn) and oxygen (O), and is formed by the sputtering, the Sn concentration of the second conductive layer 60 is, for example, 5% or less of the In concentration. The Sn concentration of the second conductive layer 60 is, for example, 2% or less of the In concentration.

A sol-gel method, curing after coating, etc., may be used as a method for forming the films. The refractive index can be reduced by using a low refractive index filler. It is favorable for the particle diameter of the low refractive index filler to be 50 nm or less. Thereby, for example, light scattering (Mile scattering by filler) due to the second conductive layer 60 can be suppressed. The particle diameter of the low refractive index filler is more favorable to be 20 nm or less. Thereby, effective total internal reflections are obtained.

In the embodiment, the reflectance of the electrode can be improved; and the light extraction efficiency can be increased. Because the reflectance can be improved by using the second conductive layer 60, a material other than Ag can be used as the first conductive layer 50. By providing the second conductive layer 60 between the semiconductor layer 25 and the first conductive layer 50, impurities (metallic elements, etc.) entering the semiconductor layer 25 from the first conductive layer 50 are suppressed; and the reliability increases.

In the embodiment, the extinction coefficient is obtained based on information from ellipsometry. For example, the extinction coefficient $\kappa$ is obtained by determining the absorption coefficient.

Figure 8:
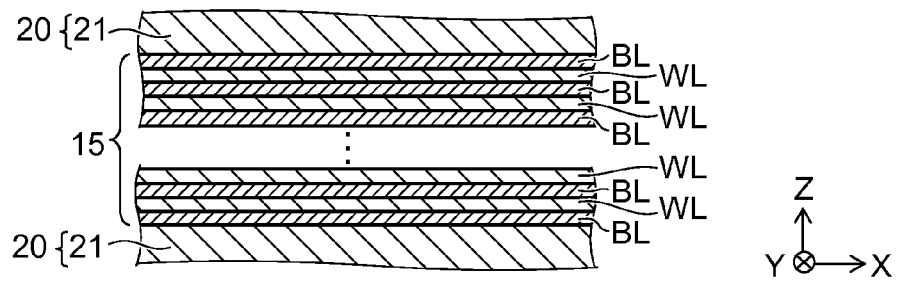
FIG. 8 is a schematic cross-sectional view illustrating a portion of the semiconductor light emitting element according to the first embodiment.

FIG. 8 is a schematic cross-sectional view illustrating a portion of the semiconductor light emitting element according to the first embodiment. As shown in FIG. 8, the third semiconductor film 15 includes a barrier layer BL and a well layer WL. In the example, multiple barrier layers BL and multiple well layers WL are provided. The multiple barrier layers BL and the multiple well layers WL are disposed alternately along the Z-axis direction. In the example, multiple well layers WL are provided. In the embodiment, the number of well layers WL may be 1.

The bandgap energy of the well layer WL is smaller than the bandgap energy of the barrier layer BL. The well layer WL includes a nitride semiconductor (e.g., InGaN) including In. The barrier layer BL includes, for example, GaN.

At least a portion of the first semiconductor film 10 is an n-type semiconductor film 11. The n-type semiconductor film 11 includes a contact layer. At least a portion of the second semiconductor film 20 is a p-type semiconductor film 21. The p-type semiconductor film 21 includes a contact layer.

Second Embodiment

Figure 9:
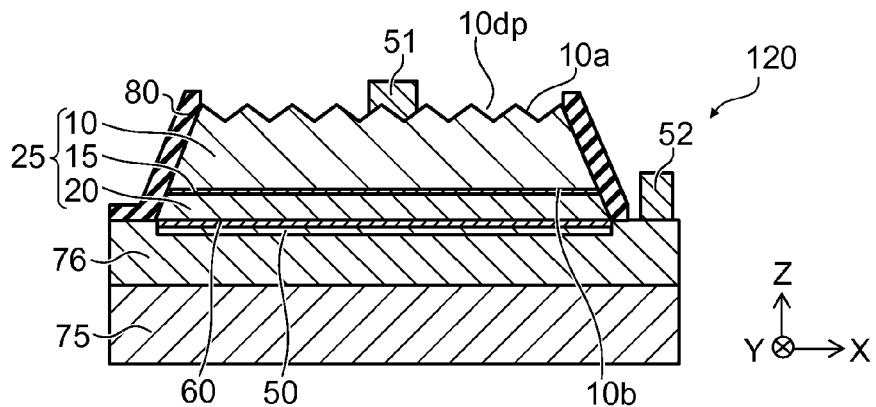
FIG. 9 is a schematic cross-sectional view illustrating a semiconductor light emitting element according to a second embodiment.

FIG. 9 is a schematic cross-sectional view illustrating a semiconductor light emitting element according to a second embodiment.

As shown in FIG. 9, in addition to the semiconductor layer 25, the first conductive layer 50, and the second conductive layer 60, the semiconductor light emitting element 120 according to the embodiment includes a first electrode 51, a second electrode 52, a supporter 75, an intermediate conductive layer 76, and a passivation film 80.

The intermediate conductive layer 76 is provided on the supporter 75. The first conductive layer 50 is provided on the intermediate conductive layer 76. The second conductive layer 60 is provided on the first conductive layer 50. The second semiconductor film 20, the third semiconductor film 15, and the first semiconductor film 10 are provided in this order on the second conductive layer 60. An unevenness $10dp$ is provided in the upper surface (a first surface $10a$) of the first semiconductor film 10. The first electrode 51 is provided on the first surface $10a$. The third semiconductor film 15 contacts a second surface $10b$ on the side opposite to the first surface $10a$.

The intermediate conductive layer 76 and the first conductive layer 50 are electrically connected. The second electrode 52 is provided on a portion of the intermediate conductive layer 76. The passivation film 80 is provided on the side surface of the semiconductor layer 25.

By applying a voltage between the first electrode 51 and the second electrode 52, a current is supplied to the semiconductor layer 25; and light is emitted from the third semiconductor film 15.

The first conductive layer 50 includes, for example, Ag. In the semiconductor light emitting element 120, the emitted light is reflected by the first conductive layer 50 and emitted to the outside from the first surface $10a$. By using the second conductive layer 60 according to the embodiment, high light extraction efficiency is obtained.

Figure 10:
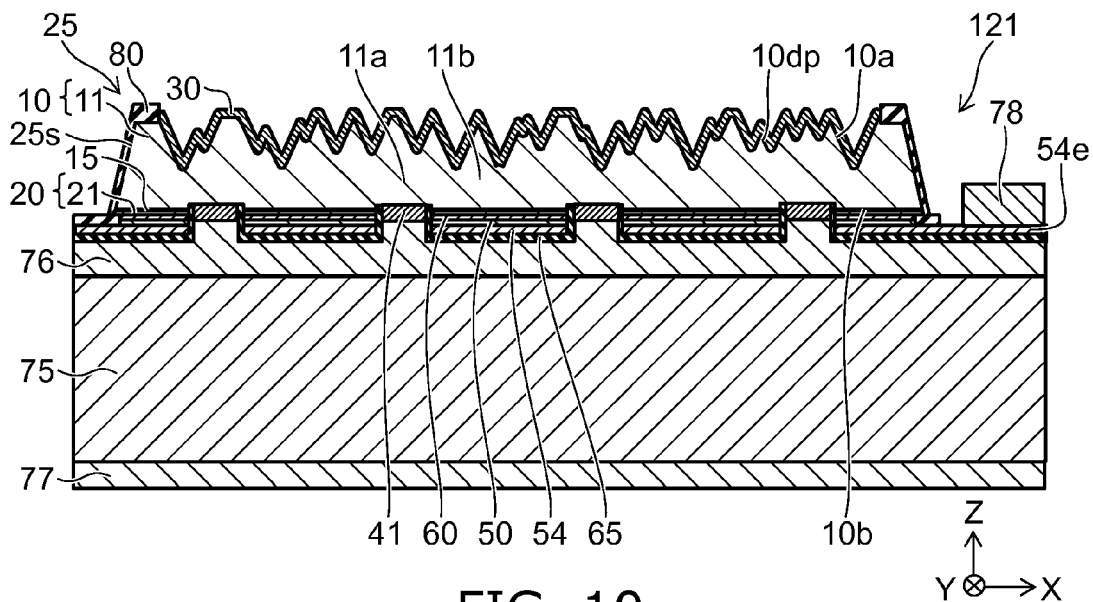
FIG. 10 is a schematic cross-sectional view illustrating another semiconductor light emitting element according to the second embodiment.

FIG. 10 is a schematic cross-sectional view illustrating another semiconductor light emitting element according to the second embodiment. As shown in FIG. 10, in addition to the semiconductor layer 25, the first conductive layer 50, and the second conductive layer 60, the semiconductor light emitting element 121 according to the embodiment includes an electrode 41, an interconnect layer 54, an insulating layer 65, the passivation film 80, the supporter 75, the intermediate conductive layer 76, a back surface electrode 77, and a pad electrode 78.

The first semiconductor film 10 includes a first semiconductor region $11a$ and a second semiconductor region $11b$. The direction from the second semiconductor region $11b$ toward the first semiconductor region $11a$ intersects the Z-axis direction.

The third semiconductor film 15 is provided between the second semiconductor region $11b$ and the second semiconductor film 20.

The second semiconductor film 20 and the third semiconductor film 15 are disposed between the first semiconductor film 10 and the supporter 75.

The electrode 41 is disposed between the first semiconductor region $11a$ and the supporter 75. The electrode 41 is electrically connected to the first semiconductor film 10. The intermediate conductive layer 76 is disposed between the electrode 41 and the supporter 75. In the example, the supporter 75 is conductive. The intermediate conductive layer 76 is conductive and electrically connects the supporter 75 to the electrode 41.

In the example, the back surface electrode 77 is provided; and the supporter 75 is disposed between the back surface electrode 77 and the intermediate conductive layer 76.

The first conductive layer 50 is provided between the supporter 75 and the second semiconductor film 20. The second conductive layer 60 is provided between the first conductive layer 50 and the second semiconductor film 20. The interconnect layer 54 is provided between the supporter 75 and the first conductive layer 50. The interconnect layer 54 is electrically connected to the second semiconductor film 20 via the first conductive layer 50. For example, the interconnect layer 54 extends along the X-Y plane.

The insulating layer 65 is disposed between the supporter 75 and the interconnect layer 54. The intermediate conductive layer 76 is disposed between the supporter 75 and the insulating layer 65. The intermediate conductive layer 76 that is electrically connected to the supporter 75 is electrically insulated from the interconnect layer 54, the first conductive layer 50, and the second semiconductor film 20 by the insulating layer 65.

One end $54e$ of the interconnect layer 54 extends through a position between the pad electrode 78 and the supporter 75. The interconnect layer 54 is electrically connected to the pad electrode 78.

The passivation film 80 is provided on a side surface $25s$ of the semiconductor layer 25 including the first semiconductor film 10, the third semiconductor film 15, and the second semiconductor film 20. Thereby, the semiconductor layer 25 is protected. The unevenness $10dp$ is provided in the first surface $10a$ of the first semiconductor film 10; and an insulating layer 30 (a protective film) is provided on the first surface $10a$.

A voltage is applied between the pad electrode 78 and the back surface electrode 77. A current is supplied to the third semiconductor film 15 via the interconnect layer 54, the first conductive layer 50, the second semiconductor film 20, the supporter 75, the intermediate conductive layer 76, the electrode 41, and the first semiconductor film 10. The semiconductor light emitting element 121 is, for example, an LED.

The light that is emitted from the third semiconductor film 15 is reflected by the electrode 41 and the first conductive layer 50, passes through the first semiconductor film 10, and is emitted to the outside.

The electrode 41 includes at least one of silver, a silver alloy, or aluminum (Al). High optical reflectance is obtained. These electrodes may include at least one of Ni, Pt, Mg, Zn, or Ti. For example, good ohmic contact with the semiconductor layer 25 is obtained.

In the semiconductor light emitting element 121 as well, high light extraction efficiency is obtained by using the second conductive layer 60 according to the embodiment.

Figure 11:
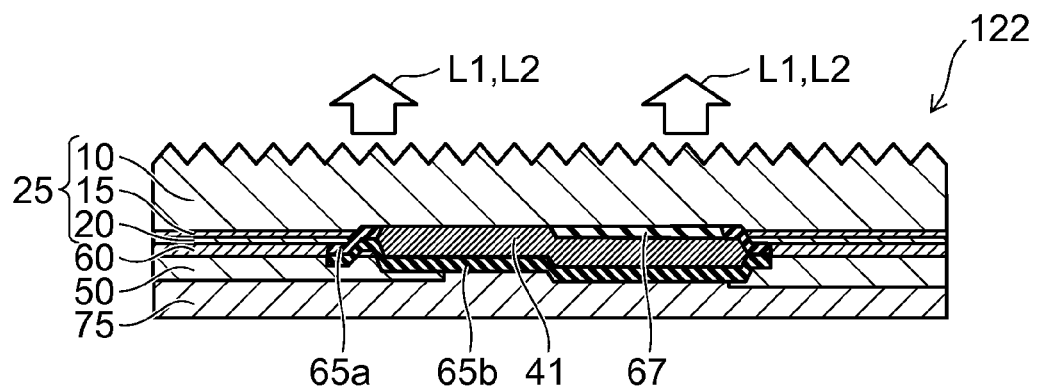
FIG. 11 is a schematic cross-sectional view illustrating another semiconductor light emitting element according to the second embodiment.

FIG. 11 is a schematic cross-sectional view illustrating another semiconductor light emitting element according to the second embodiment. As shown in FIG. 11, in addition to the semiconductor layer 25, the first conductive layer 50, and the second conductive layer 60, the semiconductor light emitting element 122 according to the embodiment includes the electrode 41, an insulating layer 65a, an insulating layer 65b, the supporter 75, and a current blocking unit 67.

The electrode 41 contacts a portion of the first semiconductor film 10. The insulating layer 65a is provided between the electrode 41 and the third semiconductor film 15 and between the electrode 41 and the second semiconductor film 20. The insulating layer 65b is provided between the supporter 75 and the electrode 41. A portion of the insulating layer 65b extends between the first conductive layer 50 and the insulating layer 65a. A portion of the insulating layer 65b is positioned between the first conductive layer 50 and the insulating layer 65a. The current blocking unit 67 is provided between the first semiconductor film 10 and a portion of the electrode 41. Current flowing between the electrode 41 and the first semiconductor film 10 is suppressed by the current blocking unit 67. For example, a material having high electrical resistance or a material having high contact resistance is used. For example, the supporter 75 functions as one of the electrodes. For example, the supporter 75 functions as a current spreading layer. The supporter 75 may include, for example, a buried solder layer. The supporter 75 may include a connection layer.

Figure 12A:
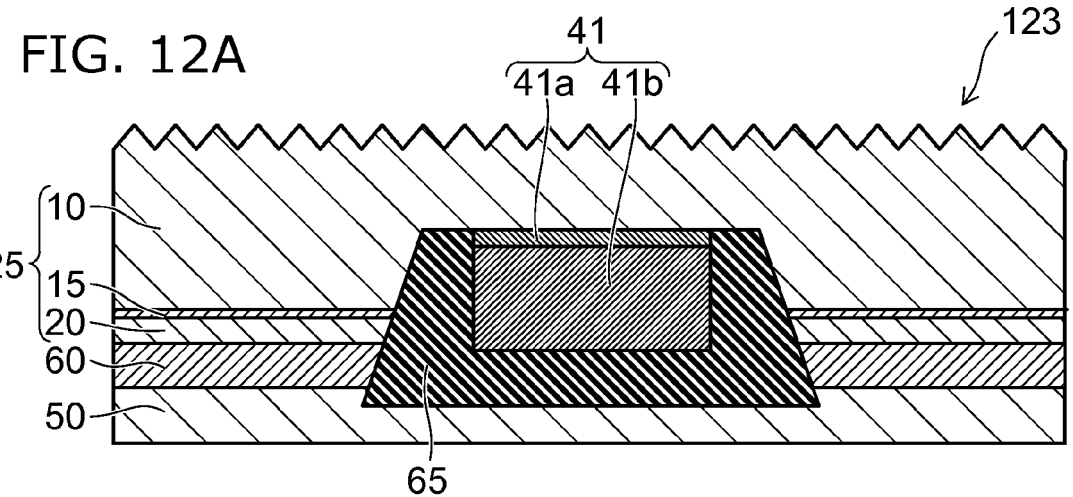
FIG. 12A and FIG. 12B are schematic cross-sectional views illustrating other semiconductor light emitting elements according to the second embodiment.
Figure 12B:
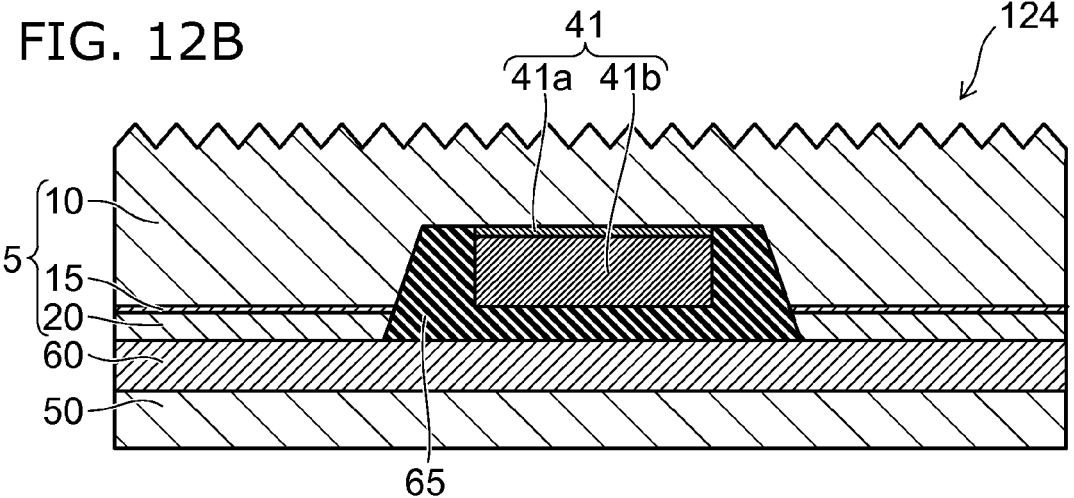

FIG. 12A and FIG. 12B are schematic cross-sectional views illustrating other semiconductor light emitting elements according to the second embodiment.

In the semiconductor light emitting element 123 as shown in FIG. 12A, the insulating layer 65 is provided between the electrode 41 and the first conductive layer 50, between the electrode 41 and the second conductive layer 60, between the electrode 41 and the second semiconductor film 20, and between the electrode 41 and the third semiconductor film 15. The insulating layer 65 also is provided between the first semiconductor film 10 and the side surface of the electrode 41. In the example, the electrode 41 includes a first electrode film 41a and a second electrode film 41b. The first electrode film 41a is provided between the second electrode film 41b and the first semiconductor film 10. The reflectance of the first electrode film 41a is higher than the reflectance of the second electrode film 41b.

In the semiconductor light emitting element 124 as shown in FIG. 12B, the position of the lower surface of the insulating layer 65 is higher than the position of the first conductive layer 50. In the example, the position of the lower surface of the insulating layer 65 substantially matches the position of the interface between the second semiconductor film 20 and the second conductive layer 60. Various modifications are possible for the position of the lower surface of the insulating layer 65.

A sol-gel method, curing after coating, etc., may be used as a method for forming the films. The refractive index can be reduced by using a low refractive index filler. It is favorable for the particle diameter of the low refractive index filler to be 50 nm or less. Thereby, for example, light scattering (Mile scattering by filler) due to the second conductive layer 60 can be suppressed. The particle diameter of the low refractive index filler is more favorable to be 20 nm or less in average. Thereby, effective total internal reflections are obtained.

FIG. 13A to FIG. 13D are schematic cross-sectional views illustrating other semiconductor light emitting elements according to the second embodiment.

Figure 13A:
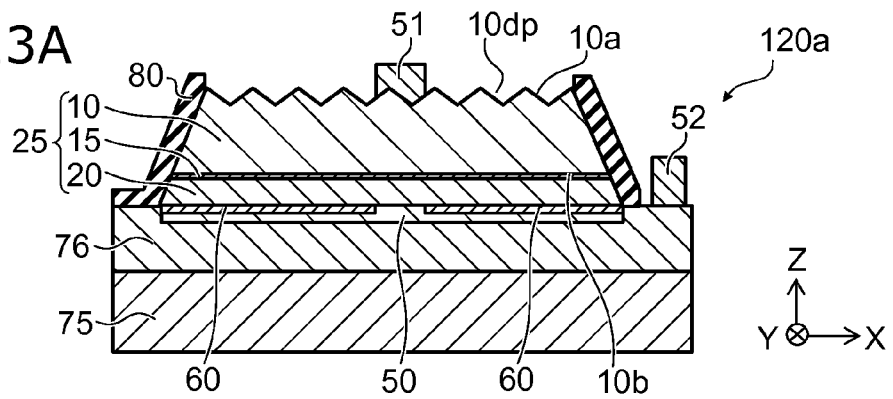
FIG. 13A to FIG. 13D are schematic cross-sectional views illustrating other semiconductor light emitting elements according to the second embodiment.

As shown in FIG. 13A, in another semiconductor light emitting element 120a according to the embodiment, a second conductive layer 60 is provided at a position not overlapping the first electrode 51 in the Z-direction. The second conductive layer 60 is not provided at a position overlapping the first electrode 51 in the Z-direction. A first conductive layer 50 is provided at the position overlapping the first electrode 51 and the position not overlapping the first electrode 51 in the Z-direction. Other points are much the same as the semiconductor light emitting element 120.

For example, a contact resistance between the first conductive layer 50 and the second semiconductor film 20 may be higher than a contact resistance between the second conductive layer 60 and the second semiconductor film 20. In such a case, in the constitution where the second conductive layer 60 is not provided at the position overlapping the first electrode 51 in the Z-direction, the contact resistance at the position overlapping the first electrode 51 in the Z-direction becomes high. For this reason, the amount of a current flowing the semiconductor layer 25 becomes smaller at the position overlapping the first electrode 51 in the Z-direction than other positions. In the case where the first electrode 51 is light blocking, light emitted at the position overlapping the first electrode 51 is blocked by the first electrode 51. This reduces the light extraction coefficient. In the semiconductor light emitting element 120a, the second conductive layer 60 is not provided at the position overlapping the first electrode 51 in the Z-direction, and thus the high light extraction coefficient can be maintained.

Figure 13B:
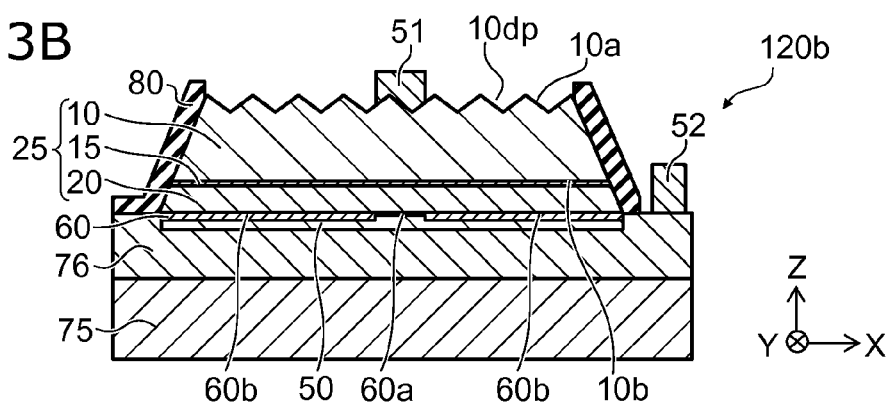

As shown in FIG. 13B, in another semiconductor light emitting element 120b according to the embodiment, the second conductivity layer 60 includes a first region 60a and a second region 60b. The first region 60a overlaps the first electrode 51 in the Z-direction. The second region 60b does not overlap the first electrode 51 in the Z-direction. A thickness of the first region 60a (a length along the Z-direction) is thinner than a thickness of the second region 60b (a distance along the Z-direction). For example, the thickness of the second region 60b is, for example, not less than 0.67 times and not more than 1.33 times of a wavelength of the light emitted from the semiconductor layer 25 in the second conductive layer 60. For example, the thickness of the first region 60a is, for example, less than 0.67 times of the wavelength of the light emitted from the semiconductor layer 25 in the second conductive layer 60. Other points are much the same as the semiconductor light emitting element 120.

Figure 13C:
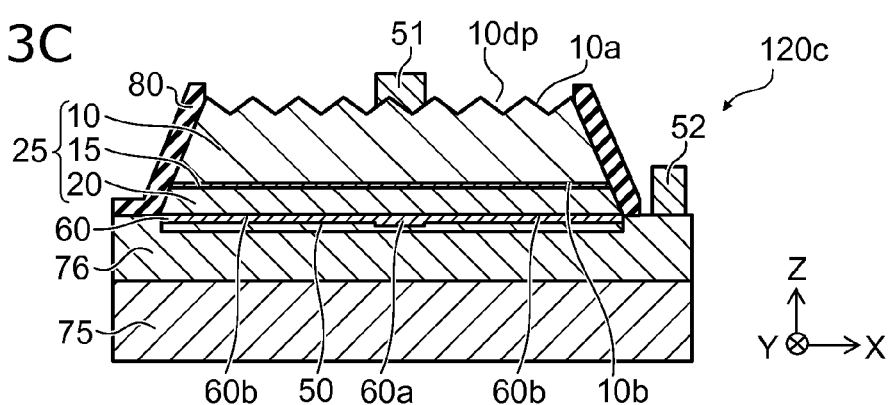

As shown in FIG. 13C, also in another semiconductor light emitting element 120c according to the embodiment, the second conductive layer 60 includes the first region 60a and the second region 60b. The first region 60a overlaps the first electrode 51 in the Z-direction. The second region 60b does not overlap the first electrode 51 in the Z-direction. The thickness of the first region 60a (a length along the Z-direction) is thicker than the thickness of the second region 60b (a distance along the Z-direction). For example, the thickness of the second region 60b is, for example, not less than 0.67 times and not more than 1.33 times of the wavelength of the light emitted from the semiconductor layer 25 in the second conductive layer 60. For example, the thickness of the first region 60a is, for example, thicker than 1.33 times of the wavelength of the light emitted from the semiconductor layer 25 in the second conductive layer 60. Other points are much the same as the semiconductor light emitting element 120.

Figure 13D:
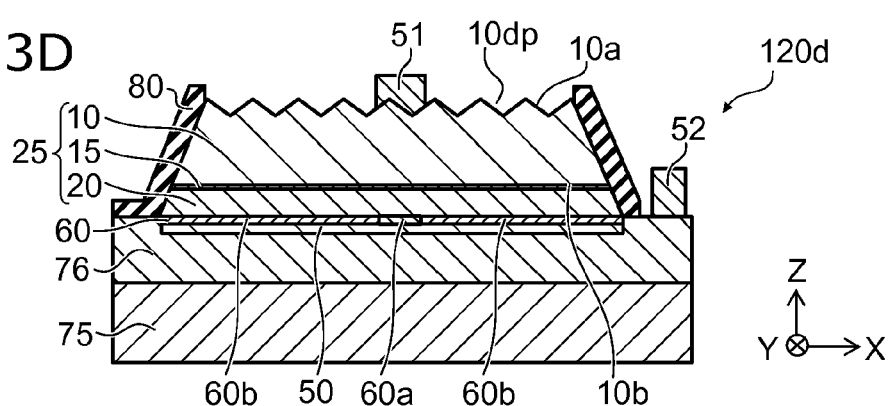

As shown in FIG. 13D, in another semiconductor light emitting element 120d according to the embodiment, the second conductive layer 60 includes the first region 60a and the second region 60b. The first region 60a overlaps the first electrode 51 in the Z-direction. The second region 60b does not overlap the first electrode 51 in the Z-direction. For example, the extinction coefficient in the second region 60b is different from the extinction coefficient in the first region 60a. For example, the electrical resistivity in the second region 60b is different from the electrical resistivity in the first region 60a. For example, a range of the refractive index in the second region 60b is different from a range of the refractive index in the first region 60a. Other points are much the same as the semiconductor light emitting element 120.

For example, in the case where the refractive index of the first region 60a is lower than the refractive index of the second region 60b, and the electrical resistivity of the first region 60a is higher than the electrical resistivity of the second region 60b, light emission immediately below the first electrode 51 is suppressed, and light loss of the light which penetrates immediately below the first electrode 51 due to the first conductive layer 50 and the second conductive layer 60 is suppressed. For this reason, the efficiency is improved. For example, the second region 60b may include a fluoride compound (for example, CaF, LiF, $MgF_2$, $LiF_3$ or the like) having a low conductivity and a low refractive index. The second region 60b may include at least one of silicon oxide (for example, $SiO_2$) and $Y_2O_3$ or the like.

FIG. 14A to FIG. 14D are schematic cross-sectional views illustrating other semiconductor light emitting elements according to the second embodiment.

Figure 14A:
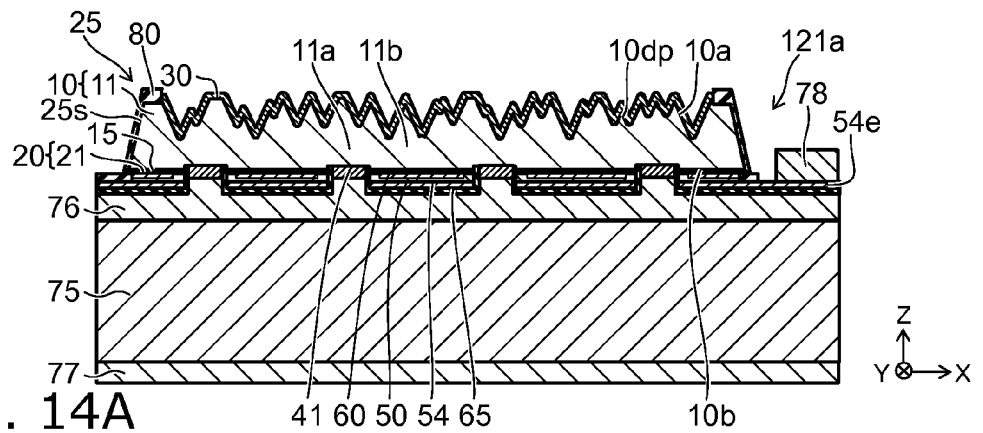
FIG. 14A to FIG. 14D are schematic cross-sectional views illustrating other semiconductor light emitting elements according to the second embodiment.

As shown in FIG. 14A, in another semiconductor light emitting element 121a according to the embodiment, the second conductive layer 60 is separated from the insulating layer 65. The second conductive layer 60 is provided at a position separated from the electrode 41. That is, the second semiconductor film 20 includes a region near the electrode 41 and a region far from the electrode 41. A distance between the region far from the electrode 41 and the electrode 41 is longer than a distance between the region near the electrode 41 and the electrode 41. The second conductive layer 60 contacts the region far from the electrode 41. The first conductive layer 50 contracts the region near the electrode 41. Other points are much the same as the semiconductor light emitting element 120. In the semiconductor light emitting element 121a, the high light extraction efficiency can be maintained.

Figure 14B:
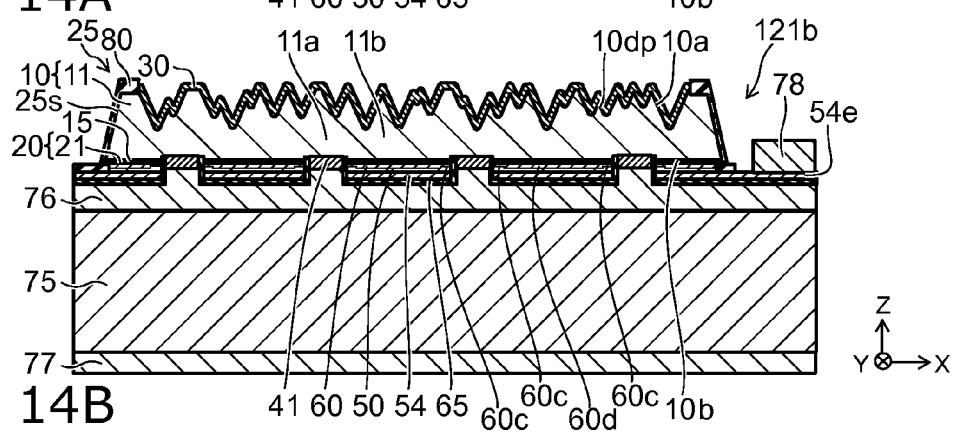

As shown in FIG. 14B, in another semiconductor light emitting element 121b according to the embodiment, the second conductive layer 60 includes a first region 60c and a second region 60d. A distance between the second region 60d and the electrode 41 is longer than a distance between the first region 60c and the electrode 41. A thickness of the first region 60c (a length along the Z-direction) is thinner than a thickness of the second region 60d (a length along the Z-direction). For example, the thickness of the second region 60d is, for example, not less than 0.67 times and not more than 1.33 times of the wavelength of the light emitted from the semiconductor layer 25 in the second conductive layer 60. The thickness of the first region 60c is, for example, less than 0.67 times of the wavelength of the light emitted from the semiconductor layer 25 in the second conductive layer 60. Other points are much the same as the semiconductor light emitting element 121.

Figure 14C:
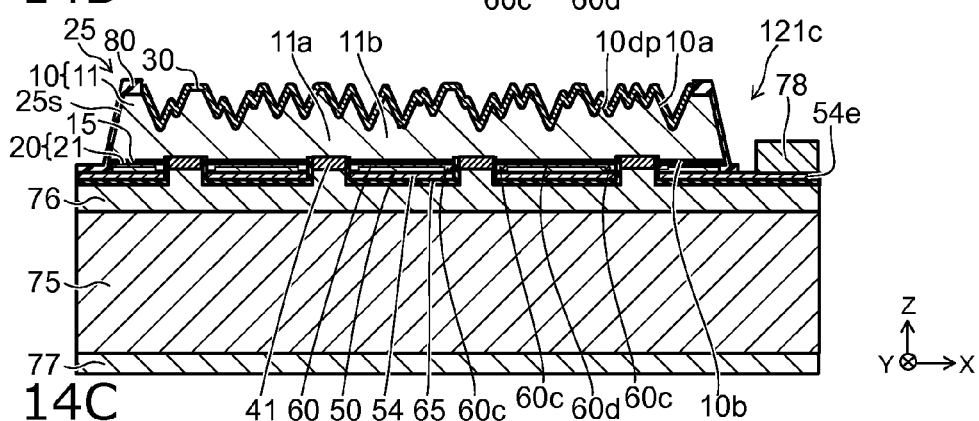

As shown in FIG. 14C, also in another semiconductor light emitting element 121c according to the embodiment, the second conductive layer 60 includes the first region 60c and the second region 60d. The distance between the second region 60d and the electrode 41 is longer than the distance between the first region 60c and the electrode 41. The thickness of the first region 60c (a length along the Z-direction) is thicker than the thickness of the second region 60d (a length along the Z-direction). For example, the thickness of the second region 60d is, for example, not less than 0.67 times and not more than 1.33 times of the wavelength of the light emitted from the semiconductor layer 25 in the second conductive layer 60. The thickness of the first region 60c is, for example, less than 0.67 times of the wavelength of the light emitted from the semiconductor layer 25 in the second conductive layer 60. Other points are much the same as the semiconductor light emitting element 121.

Figure 14D:
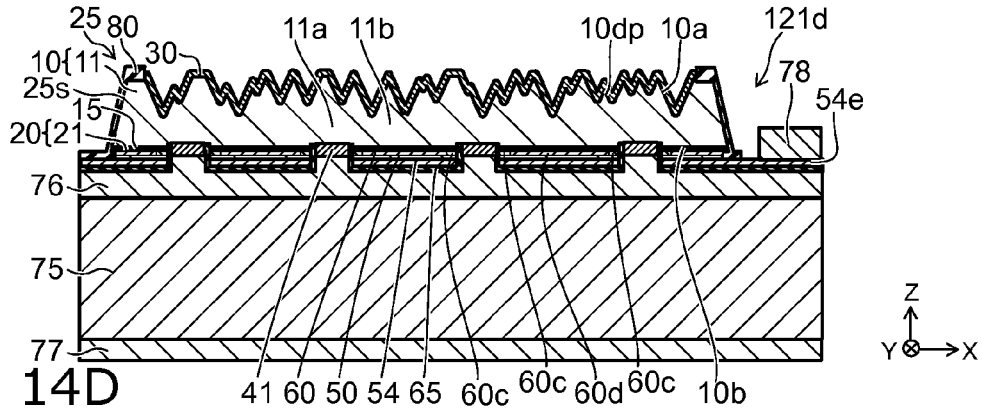

As shown in FIG. 14D, also in another semiconductor light emitting element 121d according to the embodiment, the second conductive layer 60 includes the first region 60c and the second region 60d. The distance between the second region 60d and the electrode 41 is longer than the distance between the first region 60c and the electrode 41. For example, the extinction coefficient of the second region 60d is different from the extinction coefficient of the first region 60c. For example, the electrical resistivity of the second region 60d is different from the electrical resistivity of the first region 60c. For example, the refractive index of the second region 60d is different from the refractive index of the first region 60c. Other points are much the same as the semiconductor light emitting element 121.

For example, when the electrical resistivity of the first region 60c is higher than the electrical resistivity of the second region 60d, homogeneity of a current density in a plane of the third semiconductor film 15 is increased.

Figure 15:
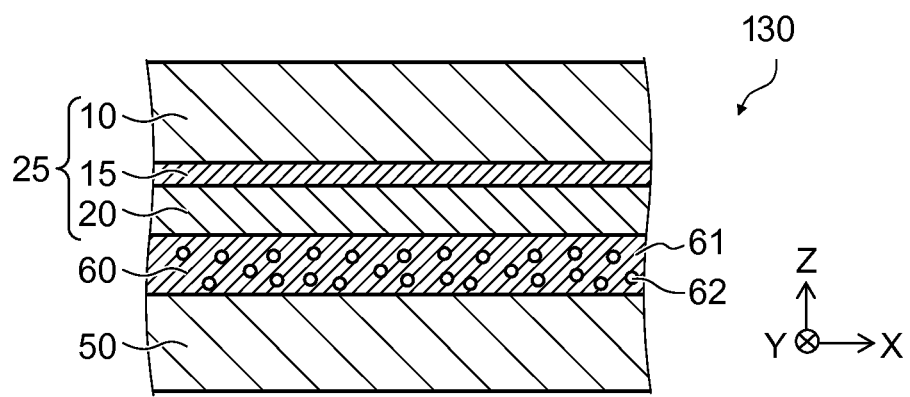
FIG. 15 is a schematic cross-sectional view illustrating a semiconductor light emitting element according to an embodiment.

FIG. 15 is a schematic cross-sectional view illustrating a semiconductor light emitting element according to an embodiment.

As shown in FIG. 15, in a semiconductor light emitting element 130 according to an embodiment, the second conductive layer 60 includes a matrix material 61 and multiple fillers 62 scattered in the matrix material 61. Other points are much the same as the semiconductor light emitting element 110.

In the semiconductor light emitting element 130, for example, a refractive index of the multiple fillers 62 is lower than a refractive index of the matrix material 61. A particle diameter of one of the multiple fillers 62 is not more than 50 nanometers.

According to the embodiment, a semiconductor light emitting element having high light extraction efficiency can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, embodiments of the invention are described with reference to specific examples. However, the invention is not limited to these specific examples. For example, one skilled in the art may similarly practice the invention by appropriately selecting specific configurations of components included in the semiconductor light emitting element such as the semiconductor film, the semiconductor layer, the conductive layer, the electrode, the insulating layer, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor light emitting elements practicable by an appropriate design modification by one skilled in the art based on the semiconductor light emitting elements described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element, comprising:
    a semiconductor layer;
    a first conductive layer; and
    a second conductive layer provided between the semiconductor layer and the first conductive layer,
    a light transmittance of the second conductive layer being higher than a light transmittance of the first conductive layer,
    an extinction coefficient of the second conductive layer being 0.005 or less.

2. The element according to claim 1, wherein an optical reflectance of the first conductive layer is higher than an optical reflectance of the second conductive layer.

3. The element according to claim 1, wherein an electrical resistivity of the second conductive layer is not less than $1.1 \times 10^{-3}$ Ω·m.

4. The element according to claim 1, wherein an electrical resistivity of the second conductive layer is not less than $2 \times 10^{-3}$ Ω·m.

5. The element according to claim 1, wherein an electrical resistivity of the second conductive layer is not less than $1 \times 10^{-2}$ Ω·m.

6. The element according to claim 1, wherein a refractive index of the second conductive layer for light emitted from the semiconductor layer is lower than a refractive index of the semiconductor layer for the light.

7. The element according to claim 1, wherein
    a refractive index of the second conductive layer for light emitted from the semiconductor layer is not less than 1.5 but less than 2.3, and
    a refractive index of the semiconductor layer for the light is not less than 2.0 and not more than 3.6.

8. The element according to claim 1, wherein
    a refractive index of the second conductive layer for light emitted from the semiconductor layer is not less than 1.6 and not more than 2.2, and
    a refractive index of the semiconductor layer for the light is not less than 2.0 and not more than 3.6.

9. The element according to claim 6, wherein a thickness of the second conductive layer is not less than 0.67 times and not more than 1.33 times a wavelength of the light in the second conductive layer.

10. The element according to claim 1, wherein
    the semiconductor layer includes a nitride semiconductor, and
    the second conductive layer includes an oxide including at least one element selected from the group consisting of In, Ga, Sn, Al, Zn, Ge, Sr, Mg, Ni, and Si.

11. The element according to claim 10, wherein the first conductive layer includes silver or an alloy including silver.

12. The element according to claim 10, wherein the first conductive layer includes aluminum or an alloy including aluminum.

13. The element according to claim 10, wherein the first conductive layer includes an alloy including silicon and aluminum.

14. The element according to claim 10, wherein the first conductive layer includes gold, copper, an alloy including gold, or an alloy including copper.

15. The element according to claim 1, wherein
    the semiconductor layer includes:
        a first semiconductor film of a first conductivity type;
        a second semiconductor film of a second conductivity type; and
        a third semiconductor film provided between the first semiconductor film and the second semiconductor film.

16. The element according to claim 15, wherein
    a first portion of light emitted from the third semiconductor film passes through the first semiconductor film and is emitted to outside, and
    a second portion of the light emitted from the third semiconductor film passes through the second semiconductor film and the second conductive layer, is reflected by the first conductive layer, passes through the second conductive layer and the semiconductor layer, and is emitted to the outside.

17. The element according to claim 15, wherein a front surface of the first semiconductor film is a light extraction surface.

18. The element according to claim 1, wherein
    the second conductive layer includes:
        a matrix material; and
        a plurality of fillers dispersed in the matrix material,
    a refractive index of the plurality of fillers is lower than a refractive index of the matrix material, and
    a particle diameter of each of the plurality of fillers is 50 nanometers or less.

* * * * *